United States Patent
Nakayama et al.

(10) Patent No.: US 7,217,576 B2
(45) Date of Patent: May 15, 2007

(54) METHOD FOR MANUFACTURING FERROELECTRIC CAPACITOR, METHOD FOR MANUFACTURING FERROELECTRIC MEMORY, FERROELECTRIC CAPACITOR AND FERROELECTRIC MEMORY

(75) Inventors: Masao Nakayama, Suwa (JP); Takeshi Kijima, Suwa (JP)

(73) Assignee: Seiko Epson Corporation (JP)

( * ) Notice: Subject to any disclaimer, the term of this patent is extended or adjusted under 35 U.S.C. 154(b) by 49 days.

(21) Appl. No.: 11/147,039

(22) Filed: Jun. 7, 2005

(65) Prior Publication Data
US 2005/0272171 A1 Dec. 8, 2005

(30) Foreign Application Priority Data
Jun. 8, 2004 (JP) .............................. 2004-170030

(51) Int. Cl.
*H01L 21/00* (2006.01)
*H01L 29/76* (2006.01)
*H01L 29/94* (2006.01)
*H01L 31/00* (2006.01)

(52) U.S. Cl. .................. 438/3; 257/295; 257/E21.664; 257/E27.104

(58) Field of Classification Search .............. 438/3; 257/295, 296, E21.007
See application file for complete search history.

(56) References Cited

U.S. PATENT DOCUMENTS

| 3,272,650 | A | 9/1966 | MacVittie | 134/7 |
| 5,607,905 | A | 3/1997 | Dobson, Jr. et al. | 507/211 |
| 6,135,987 | A | 10/2000 | Tsai et al. | 604/365 |
| 6,143,698 | A | 11/2000 | Murphey et al. | 507/145 |
| 6,394,185 | B1 | 5/2002 | Constien | 166/296 |
| 6,555,428 | B2 * | 4/2003 | Jung | 438/239 |
| 6,761,218 | B2 | 7/2004 | Nguyen et al. | 166/278 |
| 2002/0036088 | A1 | 3/2002 | Todd | 166/300 |
| 2002/0125012 | A1 | 9/2002 | Dawson et al. | 166/300 |
| 2003/0098497 | A1 * | 5/2003 | Solayappan et al. | 257/629 |
| 2003/0176073 | A1 * | 9/2003 | Ying et al. | 438/710 |

(Continued)

FOREIGN PATENT DOCUMENTS

JP 2003-243624 8/2003

OTHER PUBLICATIONS

Skrabal et al, *The Hydrolysis Rate Of Orthoformic Acid Ethyl Ether*, Chemical Institute of the University of Graz, Jan. 13, 1921, pp. 1-38.

(Continued)

*Primary Examiner*—B. William Baumeister
*Assistant Examiner*—Igwe U. Anya
(74) *Attorney, Agent, or Firm*—Harness, Dickey & Pierce, P.L.C.

(57) ABSTRACT

A method for manufacturing a ferroelectric capacitor in accordance with the present invention includes: (a) a step of forming a ferroelectric laminated body by successively laminating a lower electrode layer, a ferroelectric layer and an upper electrode layer over a base substrate; (b) a step of patterning at least the upper electrode layer and the ferroelectric layer by dry etching; (c) a step of coating a coating composition including a compound having an element composing the ferroelectric layer at least on a side wall of the ferroelectric layer; and (d) a step of thermally treating the coating composition, to crystallize the coating composition coated on the side wall of the ferroelectric layer.

9 Claims, 3 Drawing Sheets

U.S. PATENT DOCUMENTS

2005/0006095 A1  1/2005  Justus et al. ............ 166/295

OTHER PUBLICATIONS

Heller, et al., *Poly(ortho esters)—From Concept to Reality*, Biomacromolecules, vol. 5, No. 5, 2004 (pp. 1625-1632).

Schwach-Abdellaoui, et al., *Hydrolysis and Erosion Studies of Autocatalyzed Poly(ortho esters) Containing Lactoyl-Lactyl Acid Dimers*, American Chemical Society, vol. 32, No. 2, 1999 (pp. 301-307).

Ng, et al., *Synthesis and Erosion Studies of Self-Catalyzed Poly(ortho ester)s*, American Chemical Society, vol. 30, No. 4, 1997 (pp. 770-772).

Ng, et al., *Development Of A Poly(ortho ester) prototype With A Latent Acid In The Polymer Backbone For 5-fluorouracil Delivery*, Journal of Controlled Release 65 (2000), (pp. 367-374).

Rothen-Weinhold, et al., Release of BSA from poly(ortho ester) extruded thin strands, *Journal of Controlled Release* 71, 2001, (pp. 31-37).

Heller, et al., *Poly(ortho ester)s—their development and some recent applications*, European Journal of Pharmaceutics and Biopharmaceutics, 50, 2000, (pp. 121-128).

Heller, et al., *Poly(ortho esters); synthesis, characterization, properties and uses*, Advanced Drug Delivery Reviews, 54, 2002, (pp. 1015-1039).

Heller, et al., *Poly(ortho esters) For The Pulsed And Continuous Delivery of Peptides And Proteins*, Controlled Release and Biomedical Polymers Department, SRI International, (pp. 39-46).

Zignani, et al., *Subconjunctival biocompatibility of a viscous bioerodable poly(ortho ester)*, J. Biomed Mater Res, 39, 1998, pp. 277-285.

Toncheva, et al., *Use of Block Copolymers of Poly(Ortho Esters) and Poly (Ethylene Glycol)*, Journal of Drug Targeting, 2003, vol. 11(6), pp. 345-353.

Schwach-Abdellaoui, et al., *Control of Molecular Weight For Auto-Catalyzed Poly(ortho ester) Obtained by Polycondensation Reaction*, International Journal of Polymer Anal. Charact., 7: 145-161, 2002, pp. 145-161.

Heller, et al., *Release of Norethindrone from Poly(Ortho Esters)*, Polymer Engineering and Science, Mid-Aug. 1981, vol. 21, No. 11 (pp. 727-731).

U.S. Appl. No. 11/128,060, filed May 12, 2005, Saini.
U.S. Appl. No. 11/127,583, filed May 12, 2005, Saini.

\* cited by examiner

METHOD FOR MANUFACTURING FERROELECTRIC CAPACITOR, METHOD FOR MANUFACTURING FERROELECTRIC MEMORY, FERROELECTRIC CAPACITOR AND FERROELECTRIC MEMORY

RELATED APPLICATIONS

This application claims priority to Japanese Patent Application No. 2004-170030 filed Jun. 8, 2004 which is hereby expressly incorporated by reference herein in its entirety.

BACKGROUND

1. Technical Field

The present invention relates to methods for manufacturing ferroelectric capacitors, methods for manufacturing ferroelectric memories, ferroelectric capacitors, and ferroelectric memories.

2. Related Art

A ferroelectric capacitor has a structure in which a ferroelectric layer is formed between a lower electrode layer and an upper electrode layer. Such a ferroelectric capacitor is formed by patterning with dry etching.

However, because the ferroelectric layer is exposed to a plasma atmosphere when being dry etched, the ferroelectric capacitor would likely be damaged at a side wall of the ferroelectric layer. The ferroelectric capacitor damaged in this manner may have defects in its capacitor characteristics, such as, an increased leakage current, and the like.

It is an object of the present invention to provide a ferroelectric capacitor and a method for manufacturing the same, in which damaged portions formed when a ferroelectric layer is dry-etched can be repaired. Also, it is an object of the present invention to provide a ferroelectric memory using the method for manufacturing a ferroelectric capacitor, and a method for manufacturing the same.

SUMMARY

A method for manufacturing a ferroelectric capacitor in accordance with the present invention includes:

(a) a step of forming a ferroelectric laminated body by successively laminating a lower electrode layer, a ferroelectric layer and an upper electrode layer over a base substrate;

(b) a step of patterning at least the upper electrode layer and the ferroelectric layer by dry etching;

(c) a step of forming a recovery layer by coating a coating composition including a compound having an element composing the ferroelectric layer at least on a side wall of the ferroelectric layer; and (d) a step of thermally treating the coating composition coated on the side wall of the ferroelectric layer.

In the method for manufacturing a ferroelectric capacitor in accordance with the present invention, the ferroelectric layer is composed of a compound expressed by a general formula (1) below, and the coating composition includes at least a compound including an element A:

$$ABO_3 \qquad (1)$$

(where A indicates one or two or more of Pb, Ca, Sr and Ba, and B indicates one or two or more of Ti, Zr, Sn and Hf).

In the method for manufacturing a ferroelectric capacitor in accordance with the present invention, the ferroelectric layer may include at least one of La, Nb and Si.

In the method for manufacturing a ferroelectric capacitor in accordance with the present invention, the ferroelectric layer may be composed of a ferroelectric having a Bi-based perovskite structure, and the coating composition may have a compound including at least Bi.

In the method for manufacturing a ferroelectric capacitor in accordance with the present invention, the ferroelectric having the Bi-based perovskite structure may include any one of $SrBi_2Ta_2O_9$, $Bi_4Ti_3O_{12}$, $(Bi,La)_4Ti_3O_{12}$, $SrBi_2Nb_2O_9$, $CaBi_2Ta_2O_9$, $CaBi_2Nb_2O_9$, $PbBi_2Ta_2O_9$, $PbBi_2Nb_2O_9$, $Bi_3TiTaO_9$, $(Bi,Nd)_4Ti_3O_{12}$, $CaBi_4Ti_4O_{15}$, $Ca_2Bi_4Ti_5O_{18}$, $Ca_3Bi_4Ti_6O_{21}$, $PbBi_4Ti_4O_{15}$, $Pb_2Bi_4Ti_5O_{18}$, and $Pb_3Bi_4Ti_6O_{21}$.

In the method for manufacturing a ferroelectric capacitor in accordance with the present invention, the ferroelectric having the Bi-based layered perovskite structure may include Si.

In the method for manufacturing a ferroelectric capacitor in accordance with the present invention, in the step (b), the upper electrode layer and the ferroelectric layer may be dry-etched with a gas containing chlorine and oxygen.

In the method for manufacturing a ferroelectric capacitor in accordance with the present invention, after the step (b), a step of dry-etching the ferroelectric laminated body with plasma containing fluorine and a step of conducting an oxygen plasma processing may be included.

A method for manufacturing a ferroelectric memory in accordance with the present invention uses the method for manufacturing a ferroelectric capacitor recited above.

A ferroelectric capacitor in accordance with the present invention includes:

a lower electrode formed above a base substrate;

a ferroelectric formed above the lower electrode;

an upper electrode formed above the ferroelectric; and a recovery layer formed at least on a side wall of the ferroelectric, wherein the recovery layer includes a compound having an element composing the ferroelectric layer.

A ferroelectric memory in accordance with the present invention includes the ferroelectric capacitor recited above.

DETAILED DESCRIPTION

Preferred embodiments of the present invention are described below with reference to the accompanying drawings.

1. Ferroelectric Capacitor and Its Manufacturing Method

Figure 1:
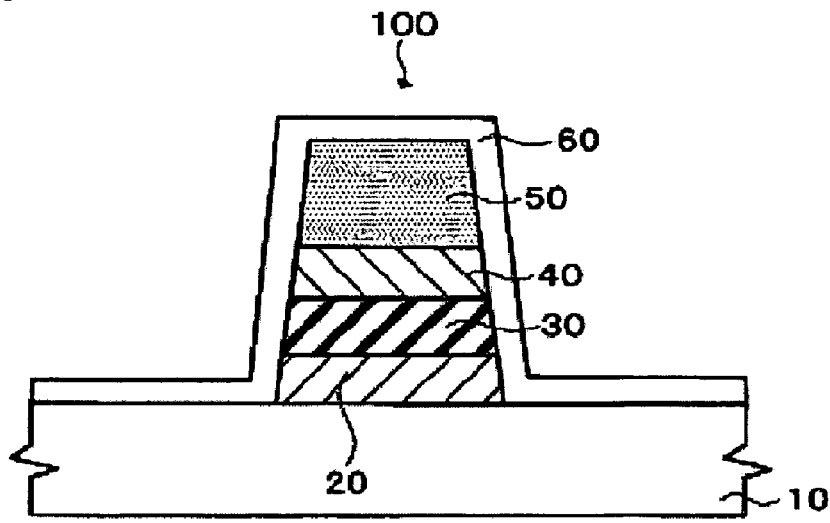
FIG. 1 is a cross-sectional view schematically showing a ferroelectric capacitor in accordance with the present embodiment.

FIG. 1 is a cross-sectional view schematically showing a ferroelectric capacitor 100 in accordance with an embodiment of the present invention. The ferroelectric capacitor 100 includes a lower electrode layer 20 formed on a base substrate 10, a ferroelectric layer 30 formed on the lower electrode layer 20, an upper electrode layer 40 formed on the ferroelectric layer 30, a hard mask layer 50 formed on the upper electrode layer 40, and a recovery layer 60. The base substrate 10 may be composed of, for example, a silicon substrate and a silicon oxide film formed thereon. Further, the base substrate 10 may have functional devices such as transistors formed thereon.

The hard mask layer 50 is a mask composed of an inorganic compound, and is different from an ordinary resist mask that is composed of an organic compound used for a photolithography process.

The recovery layer 60 is formed in a manner to cover the lower electrode layer 20, the ferroelectric layer 30, the upper electrode layer 40 and the hard mask layer 50. The recovery layer 60 includes a compound having an element composing the ferroelectric layer 30.

Because the ferroelectric capacitor 100 has the recovery layer 60, damages that may be inflicted on the ferroelectric layer 30 by plasma at the time of dry etching can be repaired.

FIG. 2 through FIG. 6 are views schematically showing a method for manufacturing the ferroelectric capacitor 100 in accordance with an embodiment of the present invention.

The method for manufacturing the ferroelectric capacitor is described herein below.

Figure 2:
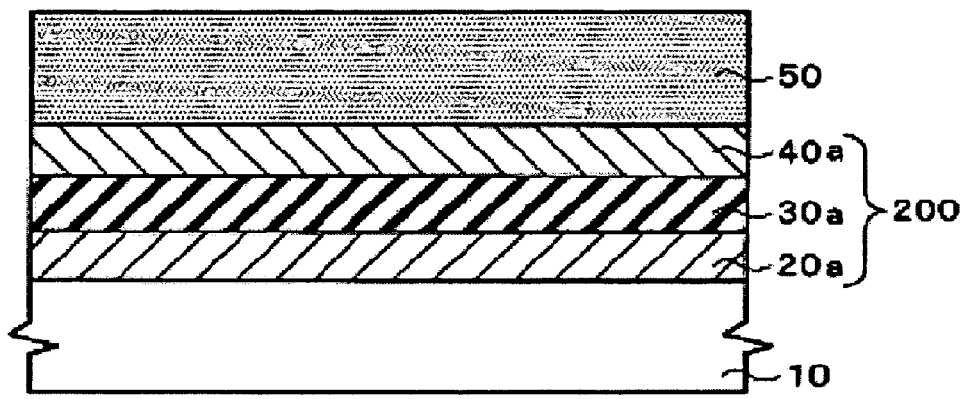
FIG. 2 is a cross-sectional view indicating a step of a method for manufacturing a ferroelectric capacitor in accordance with the present embodiment.

First, as shown in FIG. 2, a conductive layer 20a for a lower electrode, a ferroelectric layer 30a, and a conductive layer 40a for an upper electrode are successively laminated on a base substrate 10, to thereby form a ferroelectric laminated body 200. A hard mask layer 50 is laminated on the ferroelectric film laminated body 200.

The lower electrode layer 20a is not particularly limited to any material, as long as it can become an electrode of a ferroelectric capacitor. As the lower electrode layer 20a, for example, a precious metal such as Pt, Ir or the like, or its oxide (for example, $IrO_x$ or the like) may be used as its material. Further, the lower electrode layer 20 may be composed of a single layer of these materials, or a multi-layered structure having laminated layers of plural materials. The film forming method for the lower electrode layer 20a may be a known method such as a sputter method, a vacuum deposition method, a CVD method, or the like.

The ferroelectric layer 30a is composed of a ferroelectric having a perovskite structure expressed by a general formula (1) shown below, or a ferroelectric having a Bi-based layered perovskite structure expressed by a general formula (2) shown below.

$$ABO_3 \qquad (1)$$

A indicates one of Pb, Bi, Ca, Sr and Ba. B indicates one or two or more of Ti, Zr, Sn and Hf. As an example of the ferroelectric expressed by the general formula (1) above, PZT (Pb (Zr, Ti)$O_3$) or the like may be enumerated. Also, La, Nb, Si or the like may be added.

$$(Bi_2O_2)^{2+}(A_{m-1}B_mO_{3m+1})^{2-} \qquad (2)$$

m indicates a natural number that is 1 or greater.

As examples of the ferroelectric expressed by the general formula (2) above, SBT ($SrBi_2Ta_2O_9$), BIT ($Bi_4Ti_3O_{12}$), BLT (($Bi,La)_4Ti_3O_{12}$), $SrBi_2Nb_2O_9$, $CaBi_2Ta_2O_9$, $CaBi_2Nb_2O_9$, $PbBi_2Ta_2O_9$, $PbBi_2Nb_2O_9$, $Bi_3TiTaO_9$, $(Bi, Nd)_4Ti_3O_{12}$, $CaBi_4Ti_4O_{15}$, $Ca_2Bi_4Ti_5O_{18}$, $Ca_3Bi_4Ti_6O_{21}$, $PbBi_4Ti_4O_{15}$, $Pb_2Bi_4Ti_5O_{18}$, $Pb_3Bi_4Ti_6O_{21}$, and the like may be enumerated. Also, Si or the like can be added to them.

As the film forming method, a solution coating method (including a sol-gel method, a MOD (Metal Organic Decomposition) method, and the like), a sputter method, and a CVD (Chemical Vapor Deposition) method (including a MOCVD (Metal Organic Chemical Vapor Deposition) method) may be conducted.

The upper electrode layer 40a can use a material and a film forming method similar to those of the lower electrode layer 20a.

Next, a hard mask layer 50 is formed on the upper electrode layer 40. As the material of the hard mask layer 50, for example, silicon oxide, titanium nitride, titanium oxide, aluminum oxide, silicon nitride, and tungsten can be enumerated. The hard mask layer 50 may be composed of a single layer, or a laminated body of plural layers.

Figure 3:
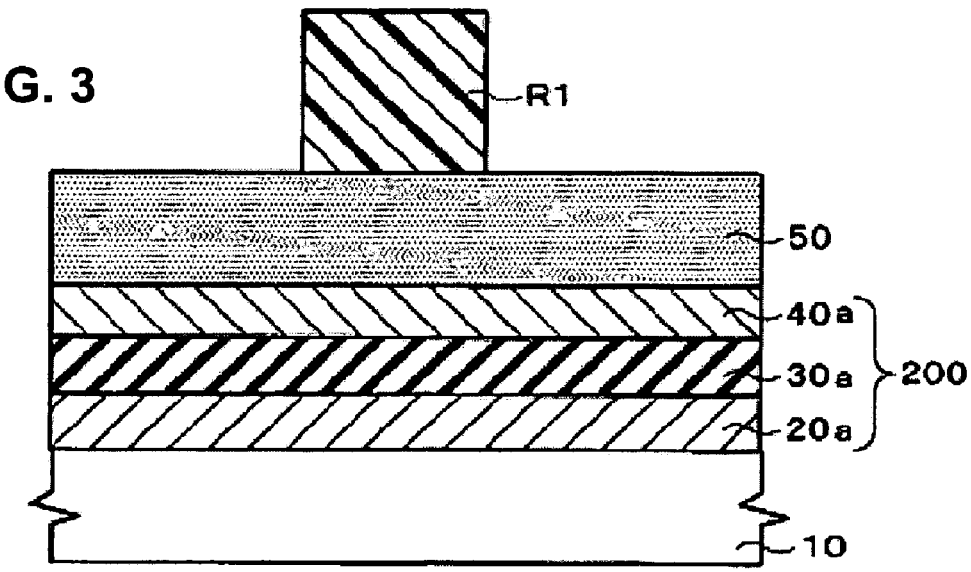
FIG. 3 is a cross-sectional view indicating a step of the method for manufacturing a ferroelectric capacitor in accordance with the present embodiment.

Next, as shown in FIG. 3, a resist layer R1 is formed. Concretely, after a resist is coated on the hard mask layer 50, the resist is patterned by a known photolithography method, whereby the resist layer R1 having a predetermined pattern is formed.

Figure 4:
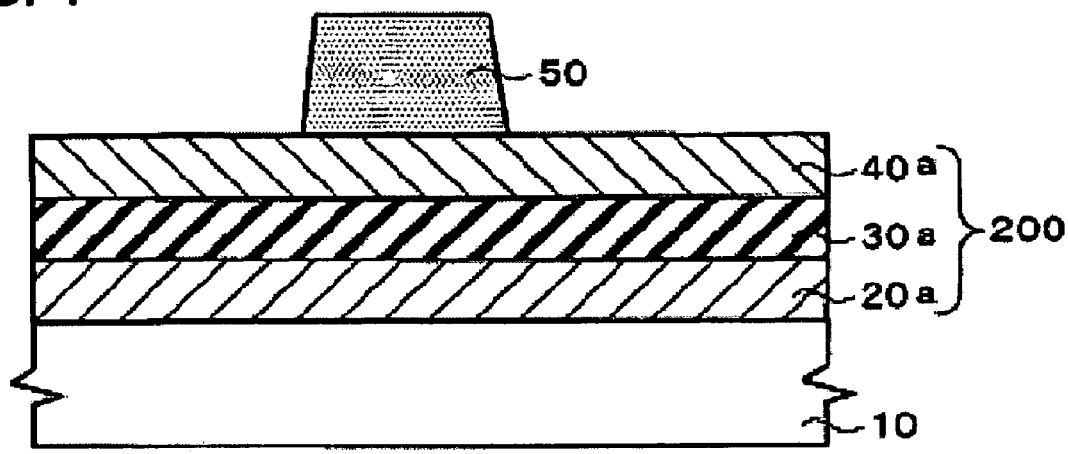
FIG. 4 is a cross-sectional view indicating a step of the method for manufacturing a ferroelectric capacitor in accordance with the present embodiment.

Then, as shown in FIG. 4, the hard mask layer 50 is etched. Concretely, by using the resist layer R1 as a mask, the hard mask layer 50 is etched by dry etching that uses, for example, ICP (inductively coupled plasma).

Figure 5:
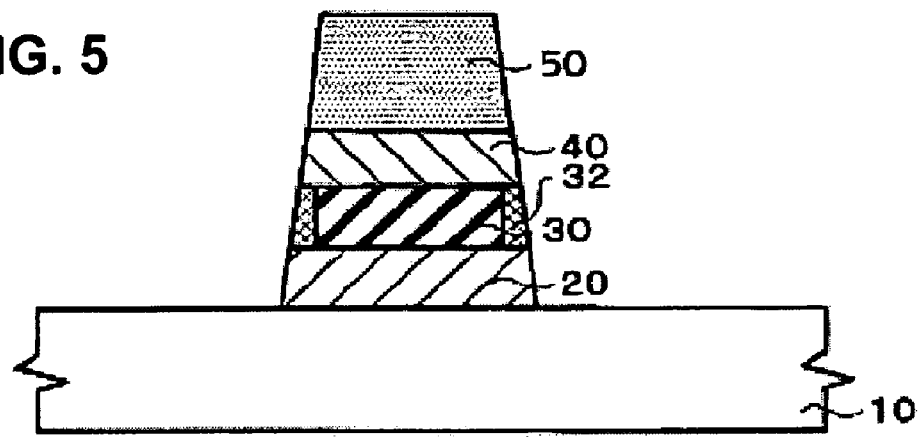
FIG. 5 is a cross-sectional view indicating a step of the method for manufacturing a ferroelectric capacitor in accordance with the present embodiment.

Next, as shown in FIG. 5, the upper electrode layer 40a, the ferroelectric layer 30a, and the lower electrode layer 20a are dry-etched to thereby pattern them. As the method for etching the lower electrode layer 20a, the ferroelectric layer 30a and the upper electrode layer 40a, an appropriate method can be selected depending of the materials thereof, and sputter etching, plasma etching or the like can be enumerate. For example, when high density plasma such as ICP plasma is used, the lower electrode layer 20a, the ferroelectric layer 30a and the upper electrode layer 40a are dry-etched by using a mixed gas of chlorine and oxygen as an etching gas. It is noted here that, to obtain a ferroelectric layer 30 and an upper electrode layer 40 in a good configuration, the mixed gas of chlorine and oxygen may have an oxygen concentration of 40–80%, with a pressure being 1.0 Pa or lower, and a bias electric power being 500 W.

In the present embodiment, the lower electrode layer 20, the ferroelectric layer 30 and the upper electrode layer 40 are formed in a batch by etching. However, depending on a desired configuration of the ferroelectric capacitor, they may be etched one layer by one layer, or one layer and two layers may be separately etched.

Then, the surface of the ferroelectric laminated body may be lightly etched by plasma containing fluorine, using carbon fluoride or the like. By this, chlorine remaining on the side wall of the ferroelectric layer 30 in the patterning step that uses the mixed gas of chlorine and oxygen described above can be removed.

After the light etching step described above, the ferroelectric laminated body may be exposed to oxygen plasma. For example, an ashing apparatus with an oxygen flow quantity being 1500 sccm, a substrate temperature being 250° C., and a plasma power being 1000 W may be used to apply an oxygen plasma treatment to the ferroelectric laminated body. By this, fluorine remaining in the light etching step described above can be removed.

In the above-described step of patterning the lower electrode layer 20a, the ferroelectric layer 30a and the upper electrode layer 40a, plasma damaged layers 32 are formed on side walls of the ferroelectric layer 30, as indicated in FIG. 5. The damaged layers 32 include amorphous. For example, when the ferroelectric layer 30 is composed of PZT, the ferroelectric layer 30 may have the damaged layers 32 in an amorphous state in which Pb atoms are vacated.

Figure 6:
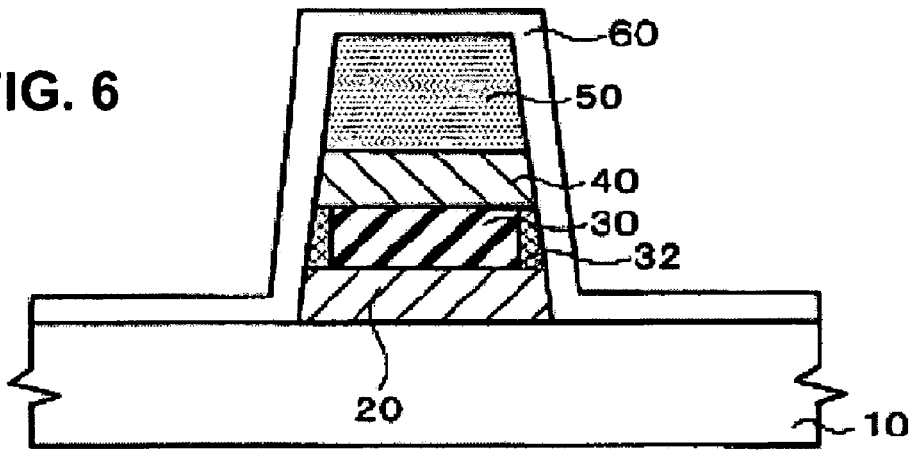
FIG. 6 is a cross-sectional view indicating a step of the method for manufacturing a ferroelectric capacitor in accordance with the present embodiment.

Next, as shown in FIG. 6, a recovery layer 60 is formed. The recovery layer 60 is formed by coating a coating composition containing a compound having an element composing the ferroelectric layer 30 on at least side walls of the ferroelectric layer 30.

When the material of the ferroelectric layer 30 is composed of a perovskite ferroelectric expressed by the general formula (1) above, the coating composition contains a compound including the element A in the general formula (1). When the material of the ferroelectric layer 30 is composed of a Bi-based layered perovskite ferroelectric expressed by the general formula (2) above, the coating composition contains a compound including a bismuth element. As the coating composition, a solution containing an organic metal or a metal alkoxide as a solute can be enumerated. When the material of the ferroelectric layer 30 is PZT, an alcohol solution of an organic metal or a metal alkoxide including Pb, for example, lead acetate, lead octylate, lead di-i-propoxy or the like can be enumerated.

As the film forming method for the recovery layer 60, a spin coat method using a sol-gel material or a MOD material, a CVD (Chemical Vapor Deposition) method, a LSMCD (Liquid Source Mist Chemical Deposition) method or the like can be enumerated.

Generally, atoms having a high vapor pressure, among atoms contained in the ferroelectric layer 30, would likely be vacated by dry etching. In other words, when the material of the ferroelectric layer 30 is a perovskite ferroelectric expressed by the general formula (1) above, A atoms would likely be vacated. When the material of the ferroelectric layer 30 is a Bi-based layered perovskite ferroelectric expressed by the general formula (2) above, bismuth atoms would likely be vacated. Accordingly, by coating a coating composition including A atoms or bismuth atoms, vacated A atoms or bismuth atoms can be compensated for in the damaged layers 32 of the ferroelectric layer 30.

The recovery layer 60, although it is formed in a manner to cover the ferroelectric laminated body in FIG. 6, may be sufficient if it is formed at least on side walls of the ferroelectric layer 30, without being limited to the above.

Then, by conducting a heat treatment, the ferroelectric layer 30, the damaged layers 32 and the recovery layer 60 are crystallized, as shown in FIG. 1. By conducting the heat treatment after filling in the damage layers 32 with vacated atoms, well-arrayed crystals are formed, and the damaged layers 32 can be repaired.

When the ferroelectric layer 30 is composed of PZT, and the damaged layers 32 are heat treated, Pb is diffused from the recovery layer 60, and PZT crystals are formed. When the heat treatment is conducted, crystals such as PbO, PZT, $PbSiO_3$, $PbTiO_3$ and the like are formed in the recovery layer 60, but this does not constitute the capacitor section and therefore does not affect the electrical characteristics thereof.

2. Ferroelectric Memory

A ferroelectric memory in accordance with the present invention includes the ferroelectric capacitor 100 described above. Also, the ferroelectric memory can be manufactured by using the method for manufacturing the ferroelectric capacitor 100 described above.

Figure 7:
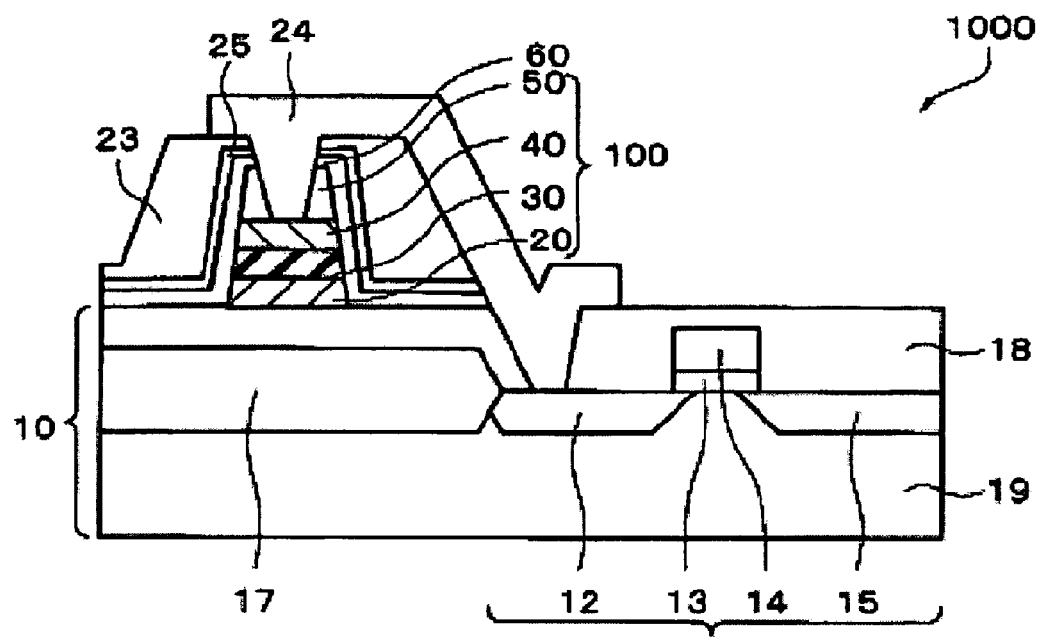
FIG. 7 is a view schematically showing a ferroelectric memory in accordance with the present embodiment.

FIG. 7 is a view schematically showing one example of a ferroelectric memory 1000 formed by applying the present invention. The ferroelectric memory 1000 has a ferroelectric capacitor 100. Also, the ferroelectric memory 1000 includes a transistor 16 in a base substrate 10.

The transistor 16 is composed of source and drain 12 and 15 formed on a substrate 19, a gate dielectric film 13, and a gate 14. It is noted that the transistor 16 can be formed by a known method.

Also, the ferroelectric memory 1000 has a dielectric layer 23 on the ferroelectric capacitor 100. A hydrogen barrier film 25 is formed in a manner to cover the ferroelectric capacitor 100. The ferroelectric capacitor 100 is connected to the transistor 16 by a wiring layer 24.

Also, the ferroelectric memory 1000 is isolated as an element from other ferroelectric memories 1000 by forming an element isolation region 17. Also, the ferroelectric capacitor 100 and the transistor 16 are insulated from one another by, for example, an interlayer dielectric film 18 composed of silicon oxide or the like that is formed on the base substrate 10, except the wiring layer 24.

It is noted that, in the present embodiment example, a process for manufacturing a so-called 1T1C type ferroelectric memory is described. However, the method for forming a ferroelectric thin film in accordance with the present embodiment can also be applied to methods for manufacturing ferroelectric memories using a variety of cell systems, such as, a so-called 2T2C type, a simple matrix type (cross-point type) and the like.

Further, the method for manufacturing a ferroelectric capacitor described above can also be used in a method for manufacturing a piezoelectric element.

3. Experiment Example

Figure 8:
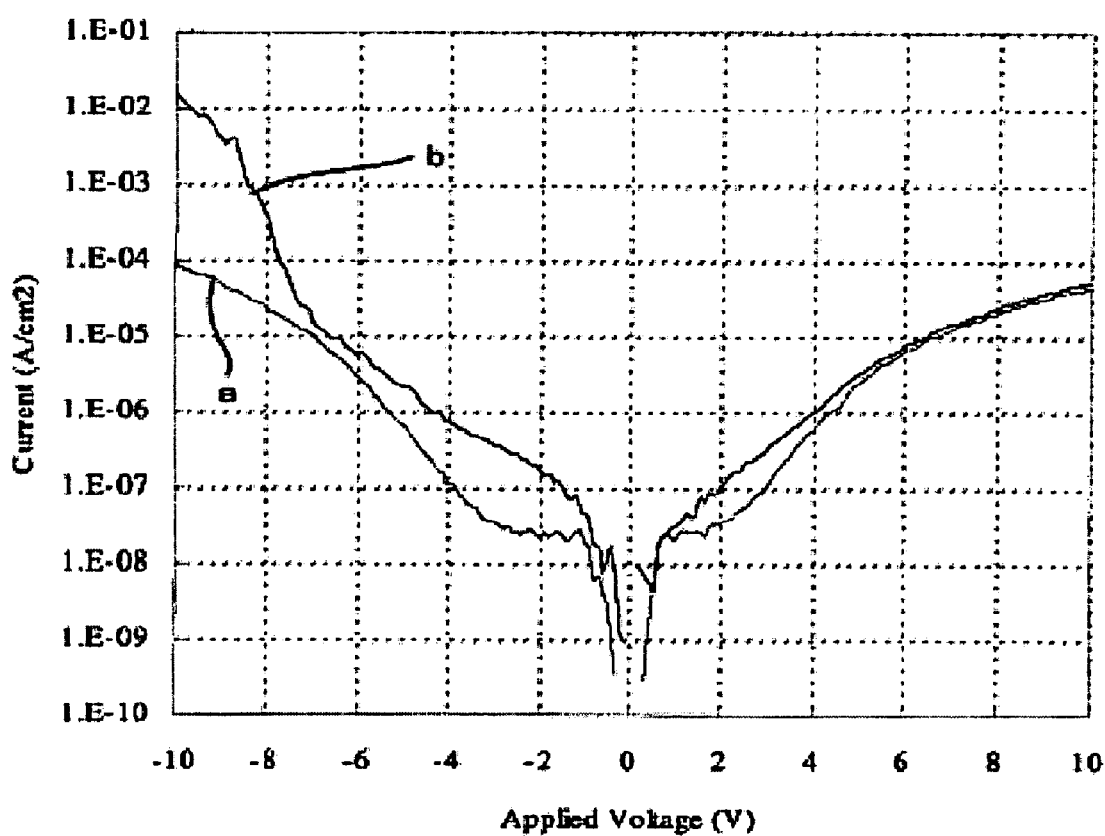
FIG. 8 is a graph showing measurement values of leakage current of ferroelectric capacitors.

FIG. 8 shows leakage characteristics of ferroelectric capacitors in accordance with the present embodiment. An axis of ordinates of the graph shown in FIG. 8 indicates current values, and an axis of abscissas indicates voltages. Measured values a indicate leakage characteristics of a ferroelectric memory using a ferroelectric capacitor of the present embodiment, and measured values b indicate leakage characteristics of a ferroelectric memory using a conventional ferroelectric capacitor. The conventional ferroelectric capacitor does not have a recovery layer.

Details of the ferroelectric capacitor in accordance with the present embodiment used for the measurement are described below.

The lower electrode layer 20 and the upper electrode layer 40 are composed of Pt, each having a film thickness of 200 nm. The ferroelectric layer 30 is composed of PZT as its material, and has a film thickness of 150 nm. The hard mask layer 50 is composed of titanium nitride, and has a film thickness of 200 nm. The recovery layer 60 is composed of PbO, and has a film thickness of 20 nm.

The lower electrode layer 20 and the upper electrode layer 40 are formed by a sputter method. The ferroelectric layer 30 is formed by forming a PZT film by spin coating, and applying a heat treatment thereto. The hard mask layer 50 is formed by a sputter method.

The recovery layer 60 is formed by forming a film of a sol-gel material containing PbO by a spin coat method, and conducting an anneal treatment for 5 minutes at 600° C. in an oxygen gas atmosphere.

The conventional ferroelectric capacitor is different from the ferroelectric capacitor 100 described above in that it does not have a recovery layer 60.

As shown in FIG. 8, by providing the ferroelectric capacitor 100 with the recovery layer 60, the ferroelectric capacitor 100 having better leakage characteristics, compared to the conventional ferroelectric capacitor, could be obtained.

Although preferred embodiments of the present invention are described above, the present invention is not limited to them, and a variety of modes can be implemented within the scope of the subject matter of the present invention.

What is claimed is:

1. A method for manufacturing a ferroelectric capacitor, comprising:
    (a) a step of forming a ferroelectric laminated body by successively laminating a lower electrode layer, a ferroelectric layer and an upper electrode layer over a base substrate;
    (b) a step of patterning at least the upper electrode layer and the ferroelectric layer by dry etching;
    (c) a step of forming a recovery layer by coating a coating composition including a compound having an element composing the ferroelectric layer at least on a side wall of the ferroelectric layer; and
    (d) a step of thermally treating the coating composition coated on the side wall of the ferroelectric layer
    wherein the ferroelectric layer is composed of a ferroelectric having a Bi-based layered perovskite structure, and the coating composition has a compound including at least Bi; and
    the ferroelectric having the Bi-based layered perovskite structure includes Si.

2. A method for manufacturing a ferroelectric capacitor according to claim 1, wherein the ferroelectric layer is composed of a compound expressed by a general formula (1) below, and
    the coating composition includes at least a compound including an element A, $$ABO_3 \qquad (1)$$

(where A indicates one or two or more of Pb, Ca, Sr and Ba, and B indicates one or two or more of Ti, Zr, Sn and Hf).

3. A method for manufacturing a ferroelectric capacitor according to claim 2, wherein the ferroelectric layer includes at least one of La, Nb and Si.

4. A method for manufacturing a ferroelectric capacitor according to claim 1, wherein the ferroelectric having the Bi-based layered perovskite structure includes any one of $SrBi_2Ta_2O_9$, $Bi_4Ti_3O_{12}$, $(Bi,La)_4Ti_3O_{12}$, $SrBi_2Nb_2O_9$, $CaBi_2Ta_2O_9$, $CaBi_2Nb_2O_9$, $PbBi_2Ta_2O_9$, $PbBi_2Nb_2O_9$, $Bi_3TiTaO_9$, $(Bi,Nd)_4Ti_3O_{12}$, $CaBi_4Ti_4O_{15}$, $Ca_2Bi_4Ti_5O_{18}$, $Ca_3Bi_4Ti_6O_{21}$, $PbBi_4Ti_4O_{15}$, $Pb_2Bi_4Ti_5O_{18}$, and $Pb_3Bi_4Ti_6O_{21}$.

5. A method for manufacturing a ferroelectric capacitor according to claim 1, wherein, in the step (b), the upper electrode layer and the ferroelectric layer are dry etched with a gas containing chlorine and oxygen.

6. A method for manufacturing a ferroelectric capacitor according to claim 5, comprising, after the step (b), a step of dry etching the ferroelectric laminated body with plasma containing fluorine and a step of conducting an oxygen plasma processing.

7. A method for manufacturing a ferroelectric memory using the method for manufacturing a ferroelectric capacitor recited in claim 1.

8. A ferroelectric capacitor comprising:
    a lower electrode formed above a base substrate;
    a ferroelectric layer formed above the lower electrode;
    an upper electrode formed above the ferroelectric layer; and
    a recovery layer formed at least on a side wall of the ferroelectric layer,
    wherein the recovery layer includes a compound having an element composing the ferroelectric layer;
    the ferroelectric layer is composed of a ferroelectric having a Bi-based layered perovskite structure, and the recovery layer has a compound including at least Bi; and
    the ferroelectric having the Bi-based layered perovskite structure includes Si.

9. A ferroelectric memory comprising the ferroelectric capacitor recited in claim 8.